United States Patent [19]

Hirao et al.

[11] Patent Number: 5,759,725

[45] Date of Patent: Jun. 2, 1998

[54] PHOTOCONDUCTORS AND ELECTROPHOTOGRAPHIC PHOTORECEPTORS CONTAINING AMORPHOUS FULLERENES

[75] Inventors: Akiko Hirao, Chiba-ken; Hirohisa Miyamoto, Kanagawa-ken; Hideyuki Nishizawa, Tokyo; Masahiro Hosoya, Saitama-ken; Masami Sugiuchi, Kanagawa-ken, all of Japan

[73] Assignee: Kabushiki Kaisha Toshiba, Kawasaki, Japan

[21] Appl. No.: 565,404

[22] Filed: Nov. 30, 1995

[30] Foreign Application Priority Data

Dec. 1, 1994 [JP] Japan ................... 6-298532
Jan. 9, 1995 [JP] Japan ................... 7-001546
Jul. 5, 1995 [JP] Japan ................... 7-169701

[51] Int. Cl.$^6$ .................................. G03G 5/06
[52] U.S. Cl. ........................ 430/58; 430/71; 430/130
[58] Field of Search ................... 430/58, 59, 71, 430/126, 130

[56] References Cited

U.S. PATENT DOCUMENTS 5,178,980  1/1993  Mort et al. .................. 430/71
5,250,378  10/1993 Wang ........................ 430/83

OTHER PUBLICATIONS

J. Mort et al., "Electronic Carrier Transport and Photogeneration in Buckminsterfullerene Films", *Appl. Phys. Lett.* 61(15): 1829–1831 (1992).

T. Asakawa et al., "Dark and Photoconductivity Behaviors of Amorphous and Crystalline $C_{60}$ Films", *Jpn. J. Appl. Phys.* 34: 1958–1962 (1995).

*Primary Examiner*—John Goodrow
*Attorney, Agent, or Firm*—Foley & Lardner

[57] ABSTRACT

Disclosed is a photoconductor comprises, a material containing fullerenes and their derivatives arranged in an amorphous structure.

20 Claims, 11 Drawing Sheets

PHOTOCONDUCTORS AND ELECTROPHOTOGRAPHIC PHOTORECEPTORS CONTAINING AMORPHOUS FULLERENES

BACKGROUND OF THE INVENTION

1. Field of the Invention

The present invention relates to a photoconductor containing a fullerene.

2. Description of the Relevant Art

Recently, it has been clarified that $C_{60}$, $C_{70}$ and other fullerenes have various characteristics, and fullerenes have been studied actively.

U.S. Pat. No. 5,250,378 relates to a photoconductor containing a fullerene complex. The photoconductor is produced by incorporating a fullerene into a polymer to form a complex with the polymer. The amount of the fullerene present is not less than the saturation amount of the fullerene. The photoconductor is used as a photoreceptor.

Appl. Phys. Lett., 61, 1829 (1992), reported by J. Mort, M. Muchorkin, R. Ziolo and I. Chen, relates to the charge-generating efficiency of a fullerene-containing photoconductor which sensitivity is lower than conventional charge-generating substances. The charge-generating efficiency of the photoreceptors set forth in U.S. Pat. No. 5,250,378 is also insufficient. Both of the photoconductors are far from their practical use as an electrophotographic photoreceptor.

SUMMARY OF THE INVENTION

The object of the present invention is to provide a photoconductor having high charge-generating efficiency by photo-irradiation.

To achieve the object and in accordance with the purpose of the present invention, the present invention provides a photoconductor comprising a material selected from the group of fullerenes and their derivatives arranged in an amorphous structure.

Further, the present invention provides a photoconductor comprising a material selected from the group of fullerenes and their derivatives wherein a pair distribution function g(R) value of the material is between about 0.7 and about 1.3 at an distance R about 30 angstroms or more.

Furthermore, the present invention provides a photoconductor comprising a material selected from the group of fullerenes and their derivatives wherein the photoconductor provides a boson peak caused by said material within a neutron inelastic scattering region of about 5 meV or less at a temperature of a glass transition temperature of said material or lower.

DESCRIPTION OF THE PREFERRED EMBODIMENTS

Figure 1:
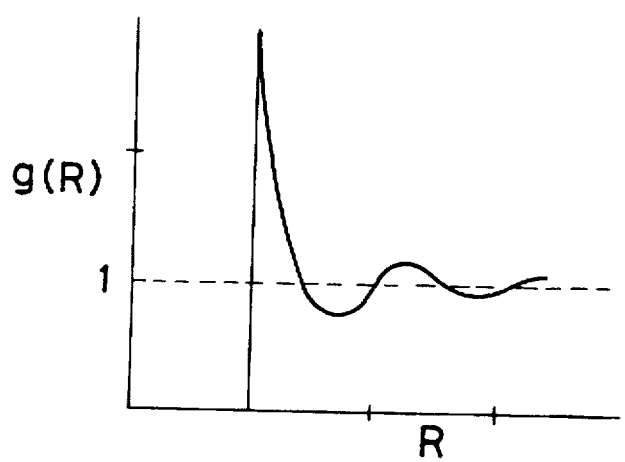
FIG. 1 is a characteristic graph showing the dependence of a pair distribution function g(R) at distance R.

The present inventors have found that non-crystalline or lower-crystalline fullerenes can show high charge-generating efficiency.

A fullerene is a carbon cluster providing a skeleton structure mostly composed of carbon atoms. The skeleton structure has a steric configuration composed of a carbon ring, such as a 5-membered carbon ring or a 6-membered carbon ring. For example, $C_{60}$ fullerene, which is a soccer ball-shaped molecule, is composed of 60 carbon atoms. $C_{60}$ fullerene is referred to as a Buckminstar fullerene or a Bucky fullerene.

In the present invention, a fullerene may comprise a carbon cluster having 60 carbon atoms or above, such as, $C_{60}$, $C_{70}$, $C_{76}$, $C_{78}$, $C_{82}$, $C_{84}$, $C_{720}$ and $C_{960}$. Further, a fullerene may comprise $C_{500}$ and $C_{540}$ fullerenes which are lengthwise cylindrical and are referred to as Bucky tubes or Nano tubes, as well as Bucky onions having a concentric core of a Bucky ball. A fullerene may comprise metal-doped fullerenes having metal atom, such as La and alkali metal atoms, doped into the carbon cluster (for example, La-doped $C_{82}$ and Sc-doped $C_{82}$ fullerenes). Accordingly, a fullerene for use in the present invention include carbon clusters composed of only carbon atoms bonded to each other and metal-doped fullerenes.

Fullerene derivatives can also be used in the present invention. These derivatives are produced by modifying fullerenes with a substituent. Such a substituent may include various atoms and atomic groups covalent by bonded or Van der Waals bonded. The fullerene derivatives also may include compounds having fullerenes in their main chains or side chains.

For example, $C_{60}O$ or $C_{60}$-1,3-dioxolane can be used as the fullerene derivatives for use in the present invention. Fullerene derivatives can be produced by partly substituting fullerenes with a substituent, for example, a covalent by bonded alkyl group (such as a methyl, a tert-butyl or a benzyl group), as well as 2-mer, 3-mer, 4-mer and 5-mer fullerenes.

In the present invention, a complex composed of an ionized fullerene and an ionized but oppositely-charged molecule is not preferable (such as charge-transfer complexes).

A charge-transfer complex is a compound where a fullerene and a host molecule are ionic-bonded. Therefore, electrons and holes contributing to ionic bonding are separated in the fullerene and the host molecule, respectively. Accordingly, a charge-transfer complex has a number of charges in the absence of photo-irradiation and has a high degree of conductivity. As a result, conductivity of a charge-transfer complex under photo-irradiation is not sufficiently higher than that under no photo-irradiation. In other words, the ratio (gain) of conductivity is low. If such a complex having a low gain is used in a photoreceptor, the functions of the photoconductor are noticeably worsened; for example, initial charge potentials (potentials before exposure) are too small.

Therefore, the present invention does not use a charge-transfer complex of fullerenes.

The present invention is described in more detail below.

Fullerenes and their derivatives preferable have 70 carbon atoms or more in a molecule, such as $C_{70}$(higher fullerenes). Since such higher fullerenes have a higher charge-generation efficiency than fullerenes having a skeleton structure of $C_{60}$, the higher fullerene is suitable as a charge generation material. An amount of higher fullerenes in fullerenes contained in a photoreceptor is preferably about 50% by total weight or more, more preferably about 80% by weight or more.

In view of mass-productivity, $C_{60}$ is better than higher fullerenes. Therefore, it is preferable that the amount of $C_{60}$ in present in a photoconductor is about 50% by weight or more in order to obtain a high productivity.

If a fullerene is arranged in a crystalline structure, charge-transfer excitons are mainly generated by photo-irradiating. Charge-transfer excitons become self-restrained rapidly and are restored to their ground state after emitting light or heat, i.e., the charge-transfer excitons are immediately inactivated.

In the present invention, since a fullerene is arranged in an amorphous structure, Frenkel excitons are mainly generated by photo-irradiating, which are hardly inactivated. Accordingly, a fullerene arranged in an amorphous structure can generate charges by photo-irradiating more efficiently than a fullerene arranged in a crystal structure.

An embodiment of the present invention is a photoconductor comprising a fullerene, which exhibits no peak intrinsic to a fullerene, during X-ray diffraction thereof, i.e., amorphous fullerenes.

The photoconductor comprising amorphous fullerenes is obtained, for example, by molecularly dispersing fullerenes in a matrix polymer.

For example, fullerenes and a matrix polymer are dissolved in a solvent and the resulting solution is dried by heating or the like so as to make the fullerenes molecularly dispersed in the matrix polymer.

In this case, if the amount of the fullerenes added to the solvent is more than the amount of the saturation solubility thereof in the solvent, the fullerenes which are not dissolved in the solvent remain as crystals thereof in the solvent. Therefore the crystal fullerenes remain in the matrix polymer. In an embodiment of the present invention, a photoconductor may contain such crystals of fullerenes. In order to provide a photoconductor having a high charge-generating efficiency, it is, however, preferable that the photoconductor does not contain such crystals in the matrix polymer, or the amount of crystals is preferably about 10% by weight or less. Therefore, where the above-mentioned method for producing the photoconductor is employed, it is preferable that the amount of the fullerenes is not higher than the amount of their saturation solubility in the solvent.

If the photoconductor contains a large amount of crystals of fullerenes, its transmittance is lowered resulting in decreased photo-irradiation in proportion to the depth of the photoconductor. In view of this, the absence of the crystals of fullerenes in the matrix polymer results in the increase in the charge-generation efficiency of the photoconductor.

If the amount of fullerenes exceeds the saturation solubility of the fullerenes in the matrix polymer, there is a possibility that the crystals of the fullerenes are formed in the matrix polymer, but the matrix polymer containing such crystals of the fullerenes is undesirable for the same reasons as mentioned above. However, if the amount of fullerenes is not more than the amount of their saturation solubility in the solvent, all the fullerenes are molecularly dispersed in the solvent. In this case, therefore, even though the amount of fullerenes is more than the amount of their saturation solubility in the matrix polymer, the precipitate of the fullerenes becomes amorphous if the solvent is removed by rapidly drying prior to the crystallization of the fullerenes. The amount of crystal fullerenes depends on the drying speed. Even in this case of rapid drying, the amount of the amorphous fullerenes in the matrix polymer can be increased, and it is possible to increase the charge-generating efficiency.

The rapid drying method for removing the solvent is not specifically restricted and may comprise any method which can shorten the drying time as compared with natural drying to be conducted at room temperature and normal pressure. For example, the rapidly drying method includes a vacuum drying method and a hot drying method. The vacuum drying method is, for example, a method of vaporizing the solvent from a sample in a vacuum of about 0.1 Torr or lower for from about 10 seconds to about 30 minutes. The hot drying method is, for example, a method of heating a substrate coated with a solution of a photoconductor composition at a temperature not higher than the boiling point of the solvent used, for from about 10 seconds to about 30 minutes so as to vaporize the solvent. If the drying is conducted in an atmosphere having a low humidity, the drying time can be shortened. By combining these methods, it is possible to shorten the drying time more.

The solvent to be used for the above-mentioned methods includes, but is not limited, alcohols, ketones, amides, sulfoxides, esters, halogenated aromatic hydrocarbons, aromatic hydrocarbons and the like. Toluene, carbon disulfide, benzene, methylene chloride and normal hexane are preferable because these solvents can dissolve a large amount of fullerenes. If charge-transfer complexes are formed, the properties as photoconductors are extremely lowered as mentioned hereinabove. Accordingly, solvents that cause conversion of fullerenes into charge-transfer complexes preferably not used in the present invention.

The matrix polymers used in the present invention must not, when mixed with fullerenes, convert or chemically alter the fullerenes into structures different from those defined by the present invention. For example, matrix polymers which form charge transfer complexes with fullerenes, such as polysilane compounds, polyvinyl carbazole and its derivatives and polyvinyltriphenylamine should not be used in the present invention.

Since optically active polymers often lower the quantum efficiency of fullerenes, it is preferable to use optically-inactive polymers in the present invention. In order to enlarge the amount of the photo-generated charge, it is required to enlarge the amount of fullerenes in the matrix polymer. Therefore, it is preferable that the fullerenes in the matrix polymer have a high solubility in the matrix polymer. Accordingly it is preferable to use a matrix polymer which can dissolve fullerenes at a concentration of about 0.1% by weight or more.

Matrix polymers preferably include polyethylene resins, nylon resins, polyester resins, polycarbonate resins, polycrylate resins, butyral resins, phenolic resins, styrene-butadiene copolymer resins, polyvinyl acetal resins, diallyl phthalate resins, polysulfone resins, acrylic resins, polyvinyl acetate resin, polyphenylene oxide resins, alkyd resins, styrene-maleic anhydride copolymer resins, vinyl chloride-vinyl acetate copolymer resins, polyester carbonates, polyvinyl chlorides, polyvinyl acetals or polyarylates. These matrix polymers can be used either singly or as mixtures of two or more.

The high charge-generation efficiency of the photoconductor comprising an amorphous fullerene is caused by fluctuation of the energy level of the amorphous fullerene due to the interaction between the adjacent fullerene molecules. The life of the exciton excited in fullerene molecules is prolonged by such energy level fluctuation. Therefore, the fullerenes of the present invention have to be amorphous or microcrystalline (the latter means the existence of crystalline fullerenes with amorphous fullerenes). In the present invention, a photoconductor may also be polycrystalline having no long-range order in its crystal structures.

An embodiment of the present invention comprises at least one of crystalline fullerenes or their derivatives having a pair distribution function g(R) of from about 0.7 to about 1.3 as obtained by their structural analysis within the region at a distance R of 30 angstroms or more. This structure is defined as a structure lacking long-rang order.

FIG. 1 is a graph showing the pair distribution function g(R) relative to the distance R. The pair distribution function g(R) indicates the probability of detecting other molecules at a distance of R apart from one atom existing at the base point. The value of g(R) is 1 in a continuous substance composed of molecules existing completely at random. A substance composed of completely crystalline molecules shall have peaks only at the positions of R that depend on the particle system of the molecules, while having g(R) value of 0 (zero) at the other positions of R. For example, $C_{60}$ fullerene having a hexagonal close-packed structure has a molecular diameter of 14.17 (Å) and shows peaks only at the positions R of 14.17 (Å), 20 (Å), 24.5 (Å), 31.7 (Å), 34.7 (Å), 40.1 (Å), 42.5 (Å), 44.8 (Å), and so on, while having g(R) value of 0 at the other positions. With losing its crystallinity, this gives a g(R) curve approaching 1, while having maximum values derived from the positions of the above-mentioned peaks.

Therefore, it is possible to increase the charge-generating efficiency of polycrystalline fullerenes in accordance with the same mechanisms as the photoconductor comprising amorphous fullerenes. In other words, the polycrystalline fullerenes should lose their crystallinity in such a degree that they have g(R) values of from 0.7 (as the minimum value) to 1.3 (as the maximum value) over the range of R which is 30 (Å) or more.

In addition, the fluctuation of the energy level of fullerenes due to the interaction between the fullerene molecules is also seen in the following case.

It is also possible to increase the charge-generating efficiency of a photoconductor comprising crystalline fullerenes that give boson peaks observed within the neutron inelastic scattering region of 5 meV or less at temperatures not higher than the glass transition point of the fullerenes.

Fullerenes which are arranged in a structure lacking long-range order can be produced, in accordance with a method comprising the following two steps.

(1) First, a fullerene system is elevated to a high energy condition by any means.

(2) Next, the energy is rapidly removed from the system.

The elevated energy condition includes liquid, gaseous and plasma conditions. To rapidly remove the heat from the system in such an elevated energy condition, the system is brought into contact with a cold substance or is applied onto a substrate by vapor deposition. More specifically, the liquid system may be rapidly cooled, or the gaseous system may be applied onto a substrate by physical vapor deposition. A vacuum vapor deposition method or a sputtering method can be used, as the rapidly cooling method.

Another employable method is one in which the mode of the aggregation of fullerenes is converted to a different one by applying energy thereto. Since the crystal structure of fullerenes is based on the Van der Waals force between the fullerene molecules, the intended modes of the aggregation of fullerenes can be attained relatively easily by this method. The method includes a treatment with mechanical stress, dipping in solvents, irradiation of neutrons, irradiation of electronic beams or laser abrasion and the like.

Next, the methods for forming aggregated fullerenes for use in the present invention are described.

A typical example of the method is a hot vapor deposition method, which is as follows. First, a substrate is set in a vapor deposition apparatus. Where the temperature of the substrate is lowered, polycrystalline fullerenes with a crystal structure lacking in long-range order or amorphous fullerenes are obtained. The temperature of the substrate is preferable about 90° C. or lower, more preferably between about 10° C. and about 50° C. Next, fullerenes to be deposited are put on the vaporizing board.

Subsequently, vapor deposition is conducted, for example, using a fullerene film having a $C_{60}$ concentration of 99% or more. It is preferable that the film is pre-treated by heating or the like to thereby remove low boiling point impurities and others therefrom. For such pre-treatment, it is preferable that while the substrate is masked the air in the vapor deposition apparatus is removed by the use of a rotary pump, a diffusion pump or the like to attain a vacuum degree of about $5 \times 10^{-7}$ Pa or less therein and the vaporizing board is heated up to suitable temperatures within about 320° C. and about 550° C.

Even though the substrate is controlled at a predetermined temperature, it is often temporarily heated at temperatures higher than the controlled temperature. However, it causes no problem in this method. The temperature of the vaporizing board depends on the structure of the fullerenes to be vaporized, the shape of the board, or the vacuum degree in the apparatus. For example, where $C_{70}$ fullerene is used as the vaporizing source under the above-mentioned conditions, it is suitable that the temperature of the vaporizing board is between about 420° C. and about 680° C.

The vapor deposition speed is desirably as high as possible and is preferably from about 0.1 to about $10^2$ angstroms/min.

A sputtering method can be used. First, fullerenes are put on a target, a substrate is set in a sputtering apparatus, and an inert gas is introduced into the apparatus, while reducing the pressure in the apparatus to thereby make the vacuum degree in the apparatus set at from about $10^{-3}$ Pa to about 10 Pa. After this, a plasma discharging is produced in the chamber. The fullerenes are sputtered by charged particles. As a result, the sputtered fullerenes are deposited on the substrate. The charged particles on the sputtered fullerenes are not specifically restricted. The charged particles may include, charged particles of inert gases, such as Ar, N and Xe, as well as other atoms that are generally used for sputtering, such as O, and the like.

An example of the rapidly cooling method is as follows: An apparatus is degassed to have a vacuum degree of, for example, from about $10^{-4}$ Pa to about 100 Pa. Fullerene, such as $C_{60}$ is placed on a board and heated at a temperature not lower than its melting point to form a liquid. After this, the board having the resulting $C_{60}$ liquid thereon is transferred onto a metal having a temperature of, for example, from about 50 K to about 150 K and then cooled. Thus, an amorphous bulky fullerene aggregate is formed. The temperature of the metal to be used in this step is preferably as low as possible to obtain a fullerene having a lower degree of crystallinity.

A method of applying mechanical stress to a fullerene aggregate in a solvent can be used. For example, first, mechanical stress is applied to a fullerene aggregate by ball milling or the like. The ball milling is conducted in a container containing balls such as ceramics, metals, glass and polymers. The size or capacity of the container to be used may vary, for example, from about 0.5 ml to about 1000 ml. One or more balls are put in the container to occupy, for example, from about 30% to about 70% of the capacity of the container including the void spaces formed by the adjacent balls.

For example, 400 balls, each having a diameter of 5 mm, are put into a 100-ml container. Then, for example, 20 ml of a solvent such as toluene, 1 g of $C_{70}$ fullerene and 2 g of a binder polymer such as polystyrene are added into the container having therein the balls. The container is set on a ball-milling apparatus and rotated, whereby energy is imparted to the fullerene while the balls are made to collide against the wall of the container. This treatment is continued for 2 hours or more, preferably about 50 hours, whereby a fullerene aggregate with a crystal structure not having long-range order is obtained. By prolonging the treating time, it is possible to further reduce the degree of crystallinity of the fullerene aggregate to form an amorphous fullerene aggregate.

As other means of imparting energy to fullerenes, there are methods of stirring fullerenes with a shaker, ultrasonically pulverizing fullerenes, using a homogenizer where fullerenes are homogenized by a fluid jet shot at solids or by attrition. A method of grinding fullerenes by passing them through a narrowed space under pressure by the use of a nanomizer or the like, or a method of partially imparting energy to fullerenes by infrared laser irradiation or exposing fullerenes to electron beams can also be used.

Also employable is a method comprising dissolving fullerenes in a solvent such as toluene, applying the resulting solution to a substrate and vaporizing the solvent to form a fullerene film on the surface of the substrate. In carrying out this method, a drying speed in vaporizing the solvent may be elevated so as to lower the degree of crystallinity of the fullerene film. In this manner, a polycrystalline fullerene film with a crystal structure not having long-range order or an amorphous fullerene film can be obtained.

The solution on the substrate may be dried in a vacuum of about 13 Pa or lower preferably within about 10 minutes, more preferably within about 5 minutes to elevate the drying speed.

It is preferable that an amount of the fullerenes in the photoconductor is about 90% by weight or more to exhibit their charge-generating efficiency more actively.

The excitons generated by irradiating a photoconductor are diffused on the surfaces of the photoconductor and are inactivated during the step.

Therefore, the charge-generating efficiency of the photoconductor can be improved by reducing the thickness of the photoconductor so that the excitons can reach the surface of the photoconductor prior to their diffusion.

When a photoconductor having thereon fullerene molecules arranged in order is formed on a photoreceptor and this is then exposed to light, the amount of light to be absorbed by the photoconductor is lowered in the direction of the depth of the film of the photoconductor. Therefore, the number of excited excitons is largest in the vicinity of the surface of the photoconductor. However, since the excitons generated in the vicinity of the surface of the photoconductor have a long distance to travel before they reach the depth of the photoconductor, the excitons are inactivated during their movement. Therefore, if the distance through which the excitons move is prolonged, the excitons will reach a state where no charges are generated. As a result, the amount of the total charges generated in the photoconductor film is lowered. In other words, it is possible to elevate the charge-generating efficiency of a photoconductor by reducing the distance between the vicinity of the surface of the photoconductor having high charge-generating efficiency and the plane at which the photoconductor receives the charges generated.

Where the photoconductor contains primarily fullerenes, the thickness of the photoconductor, is preferably about 1 µm or less. However, if the thickness of the photoconducutor is less than about 0.01 µm, it is difficult to produce the photoconductor film uniformly. Regarding the system of fullerenes dispersed in a matrix polymer, the thickness of the photoconductor may be enlarged up to about 300 µm since the transmittance of the film is high. In view of the transmittance, the content of fullerenes in a photoconductor is preferably between about 0.01% by weight and about 5% by weight. Therefore, in consideration of the charge-generating efficiency of the photoconductor, it is preferable that the thickness of the photoconductor is about 5 µm or more.

A photoconductor of the present invention is applicable to various appliances utilizing photoconductive phenomena, such as photoreceptors for electrophotographic duplicators and printers, holographic devices, photoconductive toners, resists, optical strage memories, photo-sensors, photo-switches, solar cells and photo-transducer devices.

For use as photoreceptors, a charge-generation layer and a charge-transport layer are formed on a surface of an electroconductive support. Each of the charge-generation layer and the charge-transport layer may be a single layer or multi-layer.

The fullerene provides a charge-transfer function and a charge-generation function. Therefore, a photoconductor comprising a fullerene can be used as a photoreceptor.

Where a single-layered photoreceptor comprising only fullerenes is formed, it is preferable to disperse both $C_{70}$ fullerene having a high charge-generating function and $C_{60}$ fullerene having a high charge-transport function in a matrix polymer. A photoconductor, however, may comprise a charge-transport agent.

While a thin photoconductor is preferable in order to obtain a good charge transport efficiency, a thick photoconductor is preferable so as to have a sufficient potential contrast, since a surface potential of a photoreceptor is proportional to the thickness of a photoconductor.

Therefore, it is desirable to provide a charge-transport layer in addition to the photoconductor of the present invention.

A charge-transport material substance is grouped into a hole-transport material and an electron-transport material. Any charge-transport material can be used in the present invention. Such a hole-transport material comprises a low-molecular compound such as a hydrazine compound, a pyrazoline compound, an oxazole compound, an oxadiazole compound, a thiazole compound, a thiadiazole compound, an imino compound, a ketazine compound, an enamine compound, an amidine compound, a stilbene compound, a butadiene compound and a carbazole compound. Such hole-transport materials also comprise a high-molecular compound having the substituent group in a main chain or a side chain.

An electron-transport material comprising an electron-attracting material such as chloroanil, bromoanil, tetracyanoethylene, tetracyanoquinodimethane, 2,4,7-trinitro-9-fluorenone, 2,4,5,7-tetranitro-9-fluorenone, 2,4,7-trinitro-9-dicyanomethylenefluorenone, 2,4,5,7-tetranitroxanthone and N,N-bis(3,5-dimethylphenyl)-3,4,9,10-perylenetetracarboximide. The electron transport material also includes a high-molecular compound having an electron-attracting materials in a main chain or a side chain.

A charge-transport material comprises semiconductors with an irregular structure, such as Si, Ge, Se, S, Te, B, As and Sb, and semiconductors with an irregular structure and irregular composition, such as SiC, InSb, GaAs, GaSb, $CdGe_xAs_2$, $CdSi_xP_2$, $CdSn_xAs_2$, $As_2Se_3$, $As_2S_3$, Ge—Sb—Se, Si—Ge—As—Te, Ge—As—Se, $As_2Se_3$—$As_2Te_3$, As—Se—Te, $Tl_2Se$—$As_2$, $(Cu_{(1-x)}Au_x)Te_2$, $V_2O_5P_2O_5$, MnO—$Al_2O_3$—$SiO_2$, $V_2O_5$—$P_2O_5$—BaO, CoO—$Al_2O_3$—$SiO_2$, $V_2O_5$—$GeO_2$—BaO, FeO—$Al_2O_3$—$SiO_2$, $V_2O_5$—PbO—$Fe_2O_3$, $TiO_2$—$B_2O_3$—BaO, $SiO_x$, $Al_2O_3$, $ZrO_2$, $Ta_2O_3$, $Si_3N_4$ and BN which are known as amorphous semiconductors. A charge-transport materials comprises a π-conjugated system polymers and oligomers, such as polyacetylene, polypyrrole, polythiophene and polyaniline; σ-conjugated system polymers and oligomers, such as polygermane; polycyclic aromatic compounds, such as anthracene, pyrene, phenanthrene and coronene, compounds providing nitrogen-containing hetero rings, such as indole, carbazole, oxazole, isoxazole, thiazole, imidazole, pyrazole, oxadiazole, pyrazoline, thiadiazole and triazole; and polymers providing such compounds in their main chains or side chains, and also derivatives of hydrazone compounds, triphenylamines, triphenylmethanes, butadienes, stilbenes, TCNQ, anthraquinones or diphenoquinones and the like.

The thickness of the charge-transport layer is preferably from about 5 to about 50 μm, more preferably from about 10 to about 30 μm. A surface layer of from about 0.1 to about 5 μm may be provided on a surface of a photoconductor.

The photoconductor of the present invention may also contain additives such as polymer antioxidants or ultraviolet absorbents. Such additives include hindered phenols, aromatic amines, organic sulfur compounds, phosphites, chelating agents, benzophenone compounds, benzotriazole compounds and nickel complexes, which are generally present in a photoreceptor.

To produce a photoreceptor utilizing the photoconductor of the present invention, a solution comprising fullerenes dissolved in a solvent may be coated and dried on an electroconductive support to form a photosensitive layer thereon. For this, various organic solvents can be used. Such usable organic solvents may include alcohols, ketones, amides, sulfoxides, ethers, esters, hydrogenated aromatic hydrocarbons or aromatic hydrocarbons and the like.

An electroconductive support usable in this invention comprises plates or foils of metals such as aluminum, nickel, copper and brass. A electroconductive support may also comprise plastic sheets, plastic plates, glass, fabric, paper and the like coated with electroconductive materials such as aluminum, nickel, chromium, palladium, graphite, indium oxide and tin oxide, by various electroconductive coating treatments, such as vapor deposition, sputtering and coating.

The above-mentioned electroconductive supports are suitably selected based on the end use of the photoconductor. Where a photoconductor is used as an electrophotographic photoreceptor, an aluminum support, for example, a plastic sheet such as a polyethylene terephthalate (PET) sheet coated with aluminum by vapor deposition, are preferable. Such a support is used as a thin cylindrical sheet having a suitable thickness, hardness and flexibility. It is preferable that the support itself is electroconductive or it surface is electroconductive, and the support is sufficient strength for it handling.

Where a photoconductor on a support is irradiated through the support, the support should be transparent within the wavelength range of the light source to be used for exposure.

Ordinary resins are transparent within a visible range of from 400 to 600 nm, and there are many resins which are transparent even within a long wavelength range of up to about 800 nm. Therefore, preferred as the support are polyvinyl chlorides, polyvinylidene chlorides, polyethylenes, polycarbonates, polyesters, polyamides, acrylic resins, polyimides and the like.

The photoreceptor of the present invention may have a protective layer of from about 5 to about 50 μm, more preferably from about 10 to about 30 μm formed on the surface of the photosensitive layer, if desired. Such substances may include, for example, thermoplastic resins such as acrylic resins, fluorine resins and silicone resins, thermosetting resins such as phenolic resins, melamine resins, as well as EB curable resins, X-ray curable resins, UV curable resins and urethane resins.

The protective layer may contain small amounts of additives such as an antioxidant, an ultraviolet absorbent, an anti-aging agent and the like. Examples of such additives include hindered phenols, aromatic amines, organic sulfur compounds, phosphite, chelating agents, benzophenone compounds, benzotriazole compounds, nickel complexes and the like.

The photoconductor of the present invention can be applied to optical-memories or the like, such as photo-refractive elements. In each case, the support is desirably a thin, transparent electroconductive film, which includes a plastic sheet, such as a polyethylene terephthalate (PET) sheet or the like, coated with an electroconductive substance, such as indium tin oxide (ITO), tin oxide (NESA), and the like, by vapor deposition, or glass coated with such a substance by vapor deposition or the like.

Where the photoconductor of the present invention is used as an optical-memory material, a non-linear optical substance may be dispersed therein in addition to the composition of the present invention.

Examples of the non-linear optical substance include a ternary, non-linear optical substance which includes 4-(diethylamino)-β-nitrostyrene, 3-fluoro-4-(diethylamino)-β-nitrostyrene, (4-piperidinobenzylidene)malononitrile, 2-[(α-methylbenzyl)amino]-5-nitropyridine, 4-methoxy-2'-(trifluoromethyl)-4'-nitrostilbene, 4-(diethylamino)-β-methyl-β-nitrostyrene and 4-(diethylamino)-cinnamonitrile, or the like.

EXAMPLE 1

Figure 2:
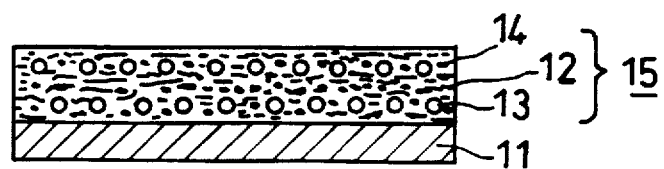
FIG. 2 is a cross-sectional view of a photoreceptor comprising a fullerene molecularly dispersed in a polymer in accordance with an embodiment of the present invention.

FIG. 2 shows a sectional view of a photoreceptor prepared in this example. The photoreceptor comprises a photoconductor layer(15) on a support(11), which is conductive.

The photoconductive layer(15) comprises a matrix polymer(12), a charge-transport material(14) and a charge-generating material(13).

The charge-generating material(13)(CGM) was 0.0167 g of high-purity (99%) $C_{70}$ fullerene. The charge-transport material(14)(CTM), a hole-transport material, was 0.451 g of N,N'-diphenyl-N,N'-bis(3-methylphenyl)-(1,1'-biphenyl)-4,4'-diamine (TPD). The matrix polymer(12) was 1.169 g of polystyrene. The CGM(13), the CTM(14) and the matrix polymer(12) were dissolved in 35.6 g of toluene respectively, so as to prepare a toluene solution. The toluene solution had no precipitate of fullerene.

The solution was coated on the support(11), which was a glass-substrate coated with indium tin oxide (ITO) by vapor deposition. The solution was fully dried at from room temperature to 60° C. so that the photoconductive layer(15) was formed on the support(11). The photoconductive layer (15) was a highly-transparent photoconductive film having a thickness of 25 μm.

Figure 3:
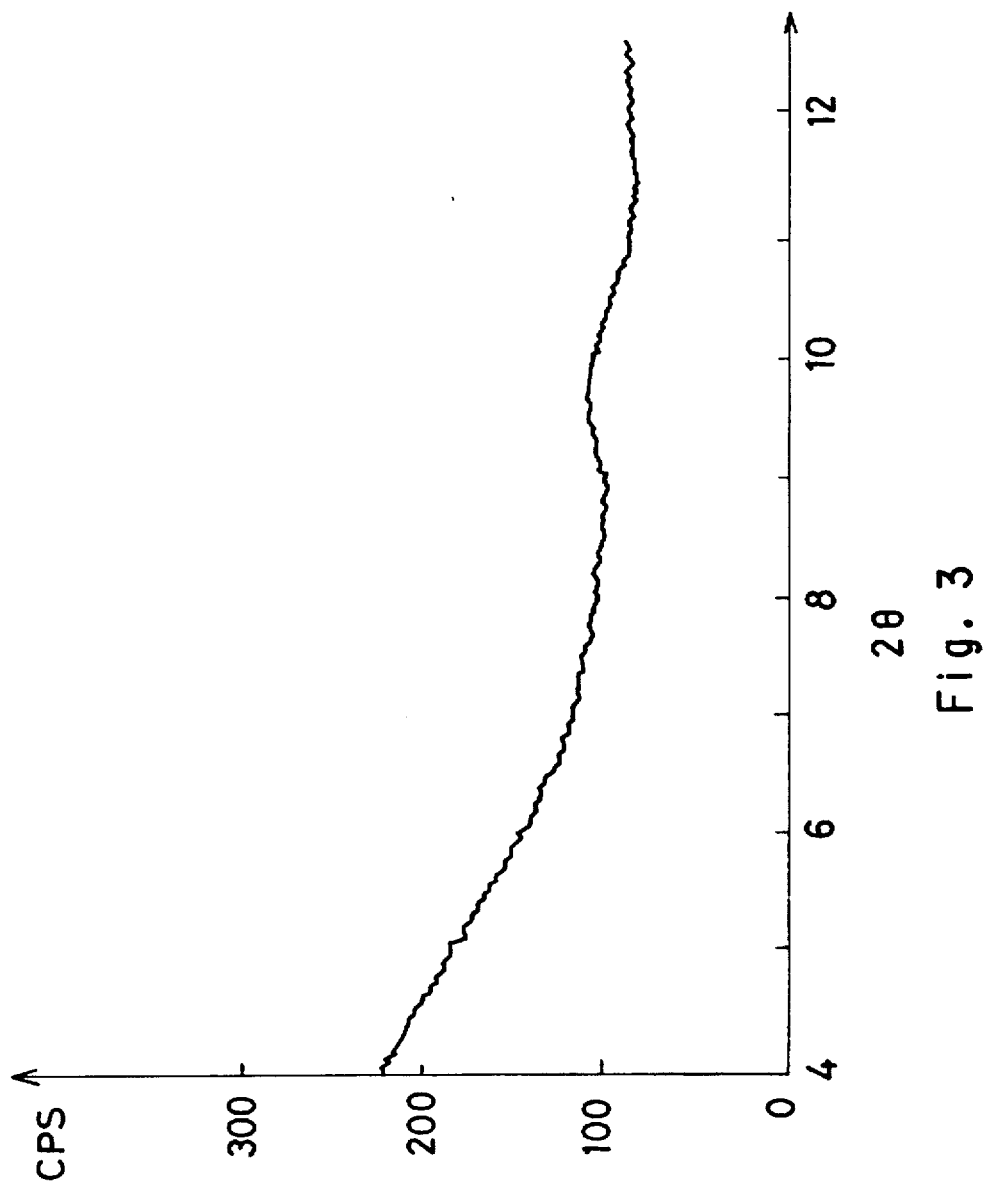
FIG. 3 is a graph showing a result of X-ray diffraction of a photoconductor of an embodiment of the present invention.

The photoconductive layer(15) was then subjected to X-ray diffractometry. The X-ray diffraction pattern of the photoconductive layer(15) is shown in FIG. 3, which does not have a short peak. Therefore, it was confirmed that the photoconductive layer(15) contained amorphous fullerene. In other words, fullerene moleculars were molecularly dispersed in the matrix polymer(12).

Figure 4:
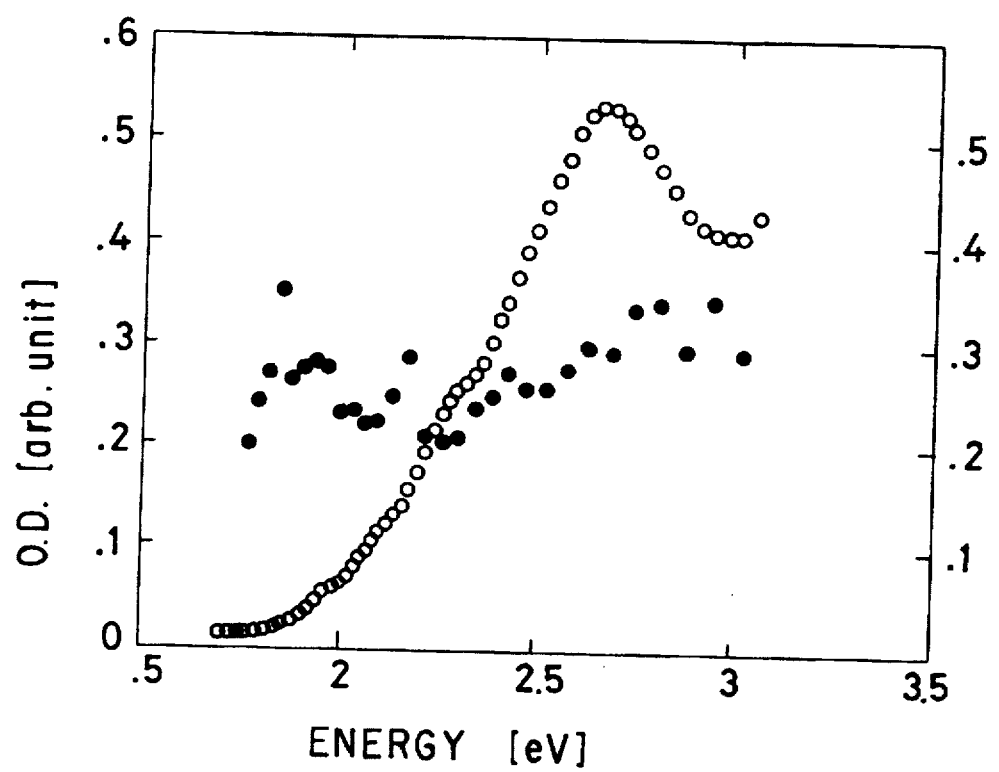
FIG. 4 is a graph showing the absorption spectrum and the quantum efficiency of a photoconductor of an embodiment of the present invention.

The absorption spectrum and the quantum efficiency of the photoconductive layer(15) were measured and are set forth in FIG. 4. In FIG. 4, white dots(open circles) indicate the absorption spectrum and the black dots indicate the quantum efficiency. As indicated in FIG. 4, the quantum efficiency(η) is about 0.3 and almost constant within the light-absorbing range. This value is higher than the quantum efficiency of organic pigments presently used. Accordingly, the photoconductor of the present invention has good photosensitive properties.

EXAMPLE 2

A second photoreceptor was prepared as follows:

A charge-generating material(CGM) of 0.0169 g of high-purity (99%) $C_{70}$ fullerene, a charge-transport material (hole-transport material)(CTM) of 0.455 g of N,N'-diphenyl-N,N'-bis(3-methylphenyl)-(1,1'-biphenyl)-4,4'-diamine (TPD) and a matrix polymer of 0.0136 g of polystyrene were dissolved in 35.6 g of toluene, so as to prepare a toluene solution. The toluene solution had no precipitate of fullerene.

The solution was coated on a support. The support was a glass-substrate coated with indium tin oxide (ITO) by vapor deposition. The solution was dried in a vacuum container at 1.3 Pa, where the temperature of the support was maintained at 60° C., for 5 minutes to form a photoconductive film having a thickness of 10 μm.

The photoconductive layer was then subjected to X-ray diffractometry. The X-ray diffraction pattern had no sharp peak. Therefore, it was confirmed that the photoconductor layer contained amorphous fullerene. In other words, fullerene molecules were molecularly dispersed in the matrix polymer. The photoconductor layer also had a low transparency.

The absorption spectrum and the quantum efficiency of the photoconductive layer were measured in the same manner as in Example 1. As a result, the quantum efficiency (η) was about 0.3 and almost constant within the light-absorbing range.

EXAMPLE 3

Figure 6:
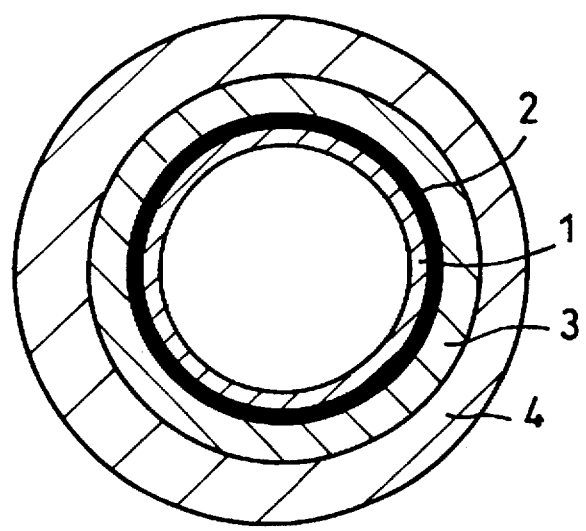
FIG. 6 is a cross-sectional view showing a photoreceptor of an embodiment of the present invention.

FIG. 6 shows a cross-sectional view of a photoreceptor having the following structure and prepared as follows.

The photoreceptor had a cylindrical support (1) which was coated with an aluminum layer(2), a charge-generating layer(3) formed on the aluminum layer and a charge-transport layer formed on a charge-generating layer(4).

A polyester film (240 mm×200 mm) having a thickness of 100 μm was coated with an aluminum layer having a surface resistivity of 500 Ω/□. The cylindrical support(1) had a radius of 60 mm and a length of 240 mm. A photoconductor film was formed on the outer surface of the cylindrical support(1) in the manner described below.

A water-soluble nylon film having a thickness of 0.2 μm was formed on the outer surface of the aluminum layer(2). A photoconductive layer, i.e., a charge-generating layer(3), having a thickness of 1 μm, was formed on the nylon film by spray-coating. The charge-generating layer(3) was composed of higher fullerenes comprising 90% by weight of $C_{70}$. The higher fullerenes also contained butyral resin at a ratio of 1:1 by weight.

Then, the cylindrical support(1) having the charge-generating layer(3) on its surface was dipped from a dispersion comprising 2 parts by weight of 4-benzylamino-2-methylbenzaldehydo-1,1-diphenyl-hydrazone, 0.1 part by weight of fullerenes comprising 85% by weight or more of $C_{60}$ fullerene, and 2 parts by weight of a polycarbonate (trade name: K-1300w produced by Teijin Chemical Co.) that were dispersed in 1,1,2-trichloroethane which proportion of weight was 88%. The cylindrical support(1) was removed from the dispersion and dried so as to form a charge-transport layer(4). As a result, the cylindrical support had the charge-transport layer(4) with a thickness of 20 μm on the charge-generating layer(3).

The sensitivity of the photoreceptor was 0.3 μJ$^{-1}$·cm$^2$. The sensitivity is defined as the reciprocal of the exposure energy required to discharge a surface potential of photoreceptor from 500 V to 250V. The half-value exposure amount means an amount of exposure which is required to reduce the surface potential of the photoconductor to a half amount of the surface potential before exposure. The sensitivity was measured with an electrostatic charge tester, EPA-8100 (produced by Kawaguchi Electric Co.).

After this, the photoreceptor was placed in an electrophotographic device with a back exposure system. The back exposure system had a light source inside of the cylindrical support. This electrophotographic device was able to output 100,000 print images at a speed of 80 images/min. All these print images were almost the same as the first image.

COMPARATIVE EXAMPLE 1

An electrophotographic photoreceptor was produced in the same manner as in Example 1, except that copper phthalocyanine was used as the charge-generating material in place of fullerenes. Therefore the charge-generating layer contained no fullerene. Its properties were evaluated in the same manner as in Example 1.

As a result, the photoreceptor had a low sensitivity of 1.5 ($\mu J^{-1} \cdot cm^2$). A printer using this photoreceptor could not produce an print images at a speed of 20 images/min. or higher. Also the image after outputting about 100,000 print images was blurred.

EXAMPLES 4 TO 6

For each example, a paper drum having a diameter of 10 mm was covered with an aluminum layer so as to have a surface resistivity of 50 $\Omega/\square$. A photoconductive layer on the outer surface of drum was formed in the manner mentioned below.

A water-soluble nylon film having a thickness of 0.2 μm was formed on the outer surface of the drum. After that, the drum was coated with a dispersion of higher fullerenes. The higher fullerenes comprised 85% by weight or more of $C_{60}$ fullerene. As a result, a charge-generating layer was formed on the surface of the drum. the thickness of the charge-generating layer was 0.05 μm (Example 4), 0.15 μm (Example 5) and 0.8 μm (Example 6).

Each of the drums coated with the charge-generating layer, was then dipped in a dispersion comprising 1,1-bis (p-diethylamino-phenyl)-4,4-diethyl-1,3-butadiene, fullerenes comprising 80% by weight of $C_{60}$ fullerene, and a polycarbonate (trade name: K-1300w produced by Teijin Chemical Co.) at a ratio by weight of 2:1:2 that were dispersed in 1,1,2-trichloroethane which proportion of weight was 88%. Each drum was taken out from the dispersion and dried to form a charge-transport layer. As a result, the drums were coated with the charge-generating layer having a thickness of 20 μm on the charge-generating layer.

The half-value exposure amount of each photoreceptor was measured, and all photoreceptors had a high sensitivity of 0.5 ($\mu J^{-1} \cdot cm^2$).

After this, each photoreceptor was set in the same electrophotographic device as that used in Example 3. This electrophotographic device could output 100,000 print images at a speed of 65 images/min. All these print images were almost the same as the first image.

Figure 5:
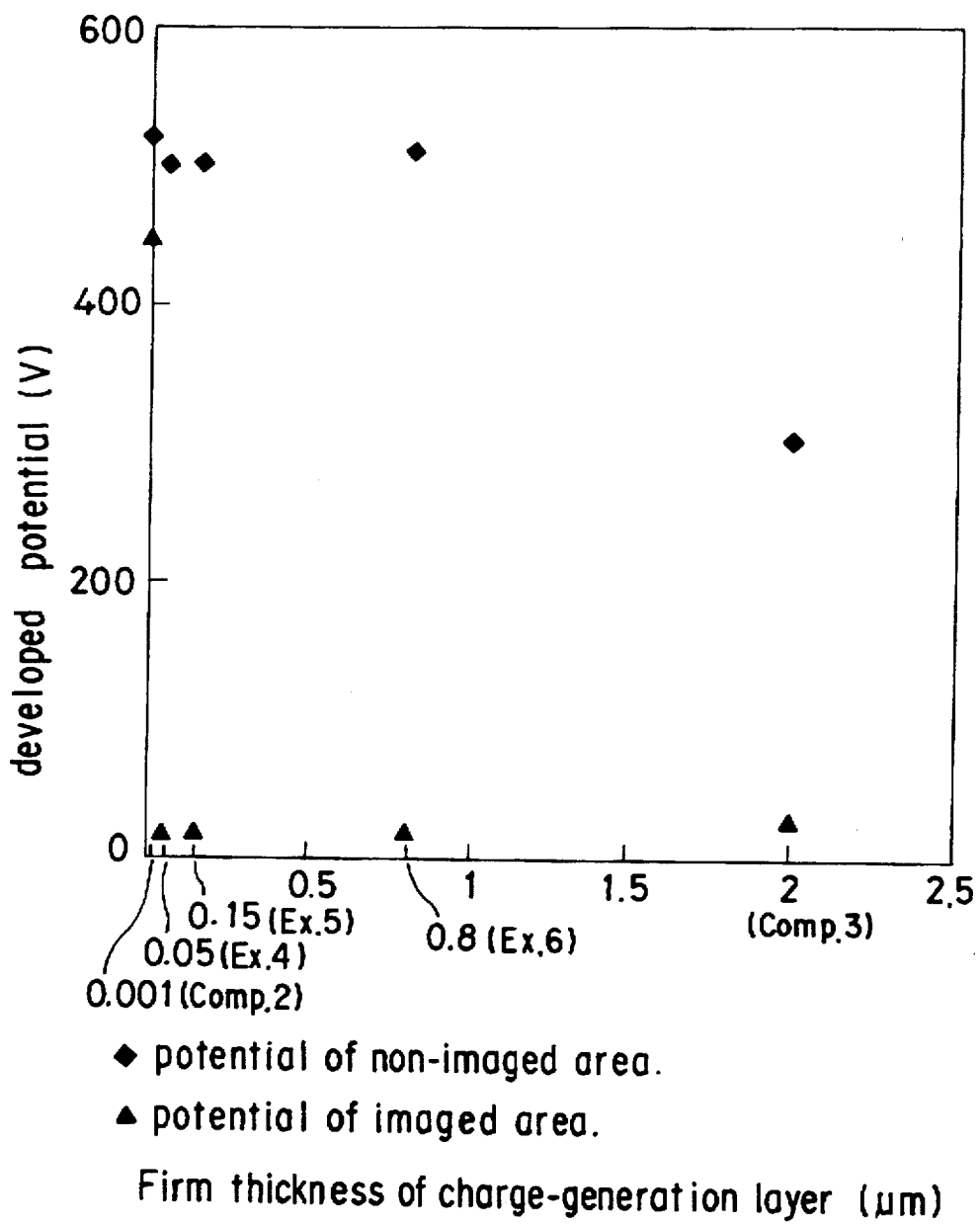
FIG. 5 is a graph showing the relationship between a potential during development and the thickness of a charge-generation layer of a photoreceptor of an embodiment of the present invention.

The potentials of the imaged area and the non-imaged area during development were measured and shown in FIG. 5. The potential of the imaged area is low, while the potential of the non-imaged area is high. Accordingly, the photoreceptors of Example 4-6 had excellent charge-retaining capacity, because the fullerenes in the photoconductive layers did not form charge-transfer complexes. Also, the layers had a low degree of dark conductivity.

COMPARATIVE EXAMPLES 2 AND 3

Electrophotographic photoreceptors were produced in the same manner as in Example 1, except that the thickness of the charge-generating layer was varied to 0.001 μm (Comparative Example 2) and 2 μm (Comparative Example 3), and their sensitivity was measured. However, the sensitivity of the electrophotographic photoreceptor of Comparative Example 2 could not be measured. The sensitivity of the electrophotographic photoreceptor of Comparative Example 3 was 1.2 ($\mu J^{-1} \cdot cm^2$). The potentials of the imaged area and the non-imaged area during development are also shown in FIG. 5. The potential of the imaged area was high with the electrophotographic photoreceptor of Comparative Example 2 while the potential of the non-imaged area was low with the electrophotographic photoreceptor of Comparative Example 3. From this, it is known that imaging with these photoreceptors is impossible.

EXAMPLE 7

An aluminum round rod having a diameter of 15 mm was dipped in a dispersion comprising 1-phenyl-1,2,3-tetrahydroquinoline-6-carboxyaldehydo-1,1-diphenylhydrazone and a polycarbonate (trade name: K-1300w, produced by Teijin Chemical Co.) at a ratio by weight of 1:2 that were dissolved in 1,1,2-trichloroethane which proportion of weight was 85%, and then dried to form a charge-transport layer having a thickness of 20 μm.

The charge-transport layer was coated with a dispersion of higher fullerenes comprising 85% by weight of $C_{70}$. The higher fullerenes dispersed in an organic solvent, by spray-coating, to form thereon a charge-generating layer. This charge-generating layer was then coated with a thermosetting silicone resin to form thereon a protective layer having a thickness of 0.5 μm. The sensitivity of the photoreceptor was about 0.25 ($\mu J^{-1} \cdot cm^2$).

This photoreceptor was set in the same electrophotographic device as in Example 3. This electrophotographic device outputted 100,000 print images at a speed of 40 images/min, and all these print images obtained were almost the same as the first image.

EXAMPLE 8

An electrophotographic photoreceptor was produced in the same manner as in Example 7, except that the fullerenes in the charge-generating layer comprised 90% by weight of $C_{60}$ fullerene. This was set in an electrophotographic device and subjected to repeated charging, exposure, development and image transfer. As a result, imaging was possible at a speed of 3 images/min.

EXAMPLES 9 TO 13

In each example, a cylinder having a diameter of 10 mm was coated with an aluminum layer having a surface resistivity of 500 $\Omega/\square$. The cylinder was further coated with a photoconductive layer in the manner mentioned below.

The coated cylinders was coated with fullerenes comprising 90% by weight of $C_{70}$, so as to form a photoconductive layer, i.e., a charge-generating layer. The thickness of the charge-generating layer was 0.005 μm (Example 9), 0.015 μm (Example 10), 0.15 μm (Example 11), 0.8 μm (Example 12) and 1.2 μm (Example 13).

The same charge-transport layer as in Example 4 was formed on the charge-generation layer.

The sensitivity, that is defined as the reciprocal of the exposure energy required to discharge a surface potential of photoreceptor from 500 V to 250 V was about 1.0 ($\mu J^{-1} \cdot cm^2$) (Example 9), about 0.4 ($\mu J^{-1} \cdot cm^2$) (Example 10), about 0.2 ($\mu J^{-1} \cdot cm^2$) (Example 11), about 0.43 ($\mu J^{-1} \cdot cm^2$) (Example 12) and about 0.9 ($\mu J^{-1} \cdot cm^2$) (Example 13). These photoreceptors all had high sensitivity. The electrophotographic photoreceptors of Examples 10, 11 and 12, where the thickness of the charge-generating layer ranged from 0.01 μm to less than 1.0 μm, had especially high sensitivity.

EXAMPLE 14

A photoreceptor having the same structure as Example 3 was prepared, except that the layer formed on the cylinder was changed to a gold layer. The cylinder was further coated with a photoconductive layer in the manner mentioned below.

A polyester film (240 mm×200 mm) having a thickness of 100 μm was coated with a gold coat having a thickness of 2000 angstroms. As a result, the gold coat had a surface resistivity of 500 Ω/□. The lengthwise sides of this film were fused together to form the cylinder of 240 mm×60 mm φ.

The cylinder was set in a vacuum chamber, and a raw material of fullerenes having a $C_{70}$ fullerene content of 99.5% or more was put on a Knudsen cell in the chamber. Next, the device was degassed to have a vacuum degree of $5\times10^{-4}$ Pa, and the cell was heated at 270° C. for 2 hours. During heating, a mask was set above the cell whereby the substances vaporized at low temperatures from the cell were prevented from reaching the cylinder. The temperature of the substrate was set at 40° C.

Next, the cell was heated to 500° C. at a rate of 5° C./min. While the cell was heated to 500° C., 50% by weight or more of the fullerenes on the cell were vaporized and deposited to form a thin fullerene film on the cylinder. During this step, the cylinder was maintained at room temperature, but it was heated by several degrees due to the deposited fullerenes and the radiation heat from the cell. During this step, the cylinder was rotated at 30 r.p.m. to attain the uniform deposition of a charge-generating layer(CGL) of a thin fullerene layer on the cylinder. The CGL, formed by vapor deposition, had a thickness of 2000 (Å).

The CGL was then subjected to X-ray diffractometry. The X-ray diffraction pattern had no peak. The CGL gave boson peaks within the neutron inelastic scattering region of 5 meV or less.

Figure 7:
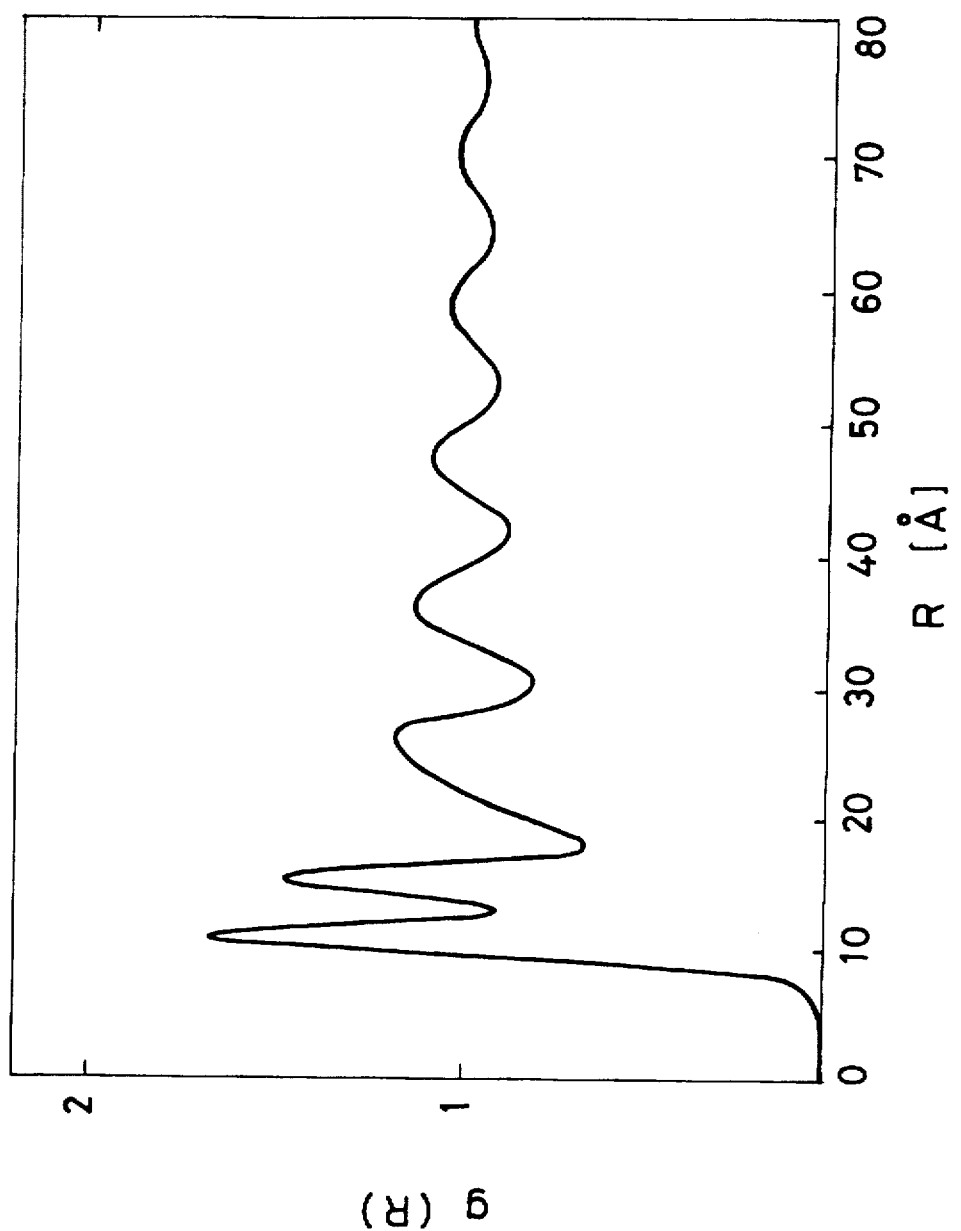
FIG. 7 is a graph showing a pair distribution function of a photoconductor of an embodiment of the present invention.

The pair distribution function g(R) of the CGL is shown in FIG. 7. The first peak appears in the vicinity of R=12 (Å), and the g(R) value is between 0.7 and 1.2 within the region of R≧20 (Å).

A dark conductivity of the CGL was measured at 10 V and 50 v, as a result its dark conductivity was $1.43\times10^{-14}$ $\Omega^{-1}m^{-1}$ and $4.64\times10^{-15}$.

A solution of N,N-diphenyl-N,N-bis(3-methylphenyl)-(1,1-biphenyl)-48,4-diamine (acting as charge-transporting molecules) and a polycarbonate resin at a ratio by weight of 1:1 that were uniformly dissolved in 1,1,2-trichloroethane was coated on the deposited film. The solution was dried to form a charge-transport layer(CTL), having CTL had a thickness of 20 μm.

The photoreceptor was set in an electrophotographic printer with a back exposure system. After the surface of the photoreceptor was charged at 500 V, which was an initial voltage, the photoreceptor was irradiated by applying data-writing radiation (wave length λ=550 nm). An exposure amount needed for reducing the charged value to the half of the initial voltage, i.e., the half-voltage exposure amount, was 0.5 [μJ$^{-1}$·cm$^2$].

Even after the repeated use of this photoreceptor, the sensitivity was still 0.5 [μJ$^{-1}$·cm$^2$].

COMPARATIVE EXAMPLE 4

A thin fullerene film was formed in the same manner as in Example 14, except that the temperature of the cylinder during the vapor deposition was changed to 120° C. A photoreceptor was produced also in the same manner as in Example 14.

Figure 8:
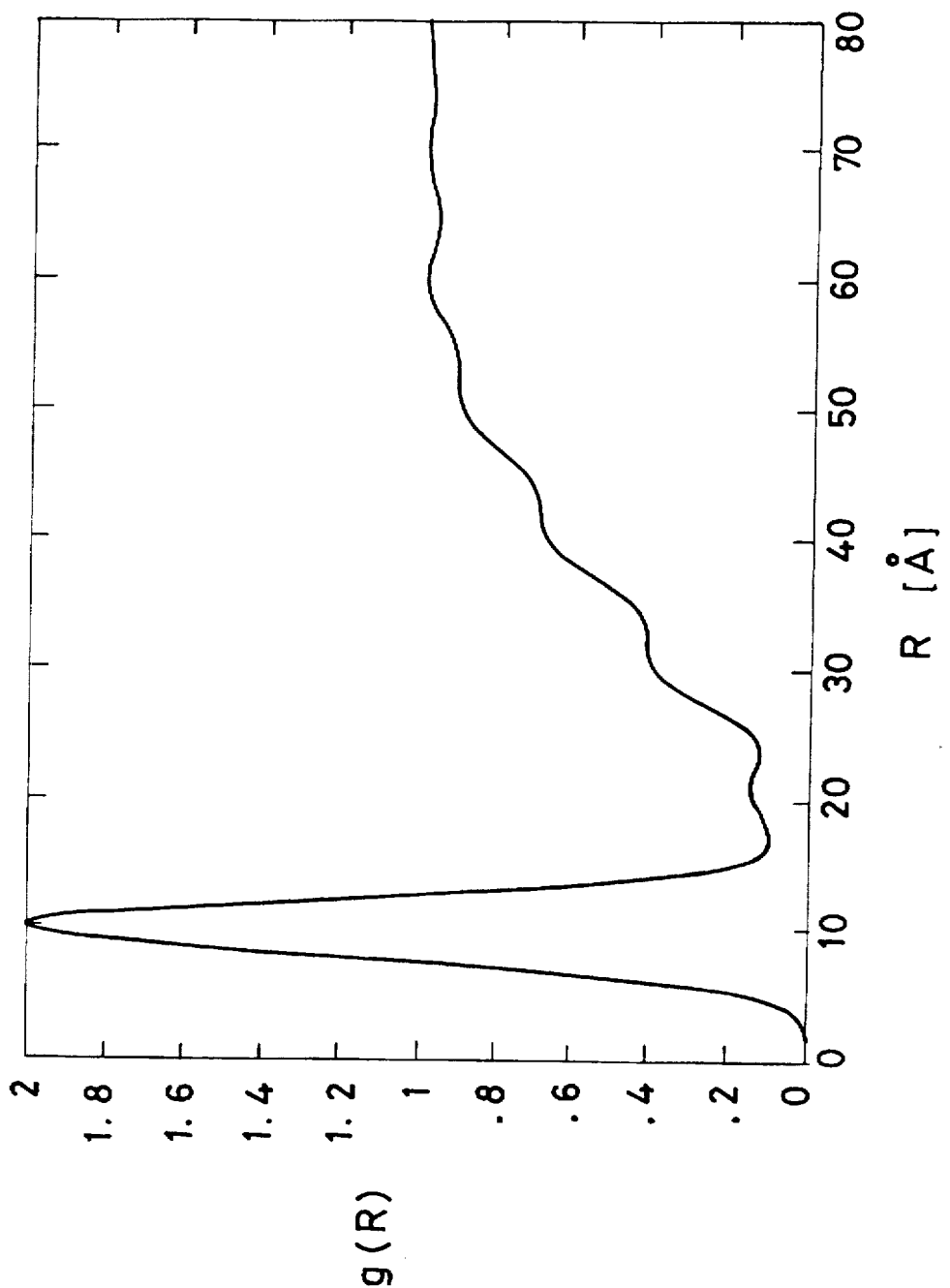
FIG. 8 is a graph showing a pair distribution function of a photoconductor of a comparative example.

The fullerene film was then subjected to X-ray diffractometry. As a result, X-ray diffraction pattern had a peak at 2 θ/deg=10 degrees. The pair distribution function of the thin fullerene film formed herein is shown in FIG. 8.

In the area of 30<R<45, the g(R) value was 0.7 or less.

A dark conductivity of the fullerene film was measured at 10 V and 50 v, as a result its dark conductivity was $2.13\times10^{-12}$ $\Omega^{-1}m^{-1}$ and $1.55\times10^{-14}$ $\Omega^{-1}m^{-1}$.

The photoreceptor was set in the electrophotographic printer with a back exposure system in the same manner as in Example 14. After the surface of the photoreceptor was charged at 500 V, the photoreceptor was irradiated by applying data-writing radiation (wave length A=550 nm). The exposure amount was 150 [μJ$^{-1}$·cm$^2$]. This was larger than that of the photoreceptor of Example 14. After the irradiation, the resistivity of the photoreceptor in the dark became small. After recharging the photoreceptor, it was impossible to again elevate the charged amount to 50 V or more. Thus, the photoreceptor could not be used repeatedly.

EXAMPLE 15

An aluminum round rod having a diameter of 5 mm was set in a vacuum chamber. A raw material of fullerenes having a $C_{78}$ fullerene content of 80% by weight was put on a Knudsen cell in the chamber. A thin fullerene film having a thickness of 1000 angstroms was deposited on the support by vapor deposition in the same manner as in Example 14. During deposition, the temperature of the support was maintained at 50° C. or lower.

After this, a solution of N,N-diphenyl-N,N-bis(3-methylphenyl)-(1,1-biphenyl)-4,4-diamine (acting as charge-transporting molecules) and a polycarbonate resin at a ratio by weight of 1:1 that were uniformly dissolved in 1,1,2-trichloroethane was coated on the deposited film, so that a charge-transport layer having a thickness of 20 μm, was formed.

The photoconductive layer was then subjected to X-ray diffractometry. The X-ray diffraction pattern had no peak.

The pair distribution function g(R) of the photoconductive layer was measured. The first peak appeared in the vicinity of R=12 ( ), and g(R) between 0.7 and 1.2 within the region of R≧20 ( ).

The photoreceptor was set in an electrophotographic printer with a back exposure system. After the surface of the photoreceptor was charged at 500 V, the photoreceptor was irradiated by applying data-writing radiation (wave length λ=550 nm). The sensitivity was 0.6 [μJ$^{-1}$·cm$^2$]. The sensitivity of the photoreceptor was extremely high.

COMPARATIVE EXAMPLE 5

A photoreceptor was produced in the same manner as in Example 15, except that the temperature of the cylinder during the vapor deposition was 200° C.

The photoconductive film was subjected to X-ray diffractometry. As a result of the X-ray diffraction pattern had a peak at (2 θ/deg)=10.

Figure 9:
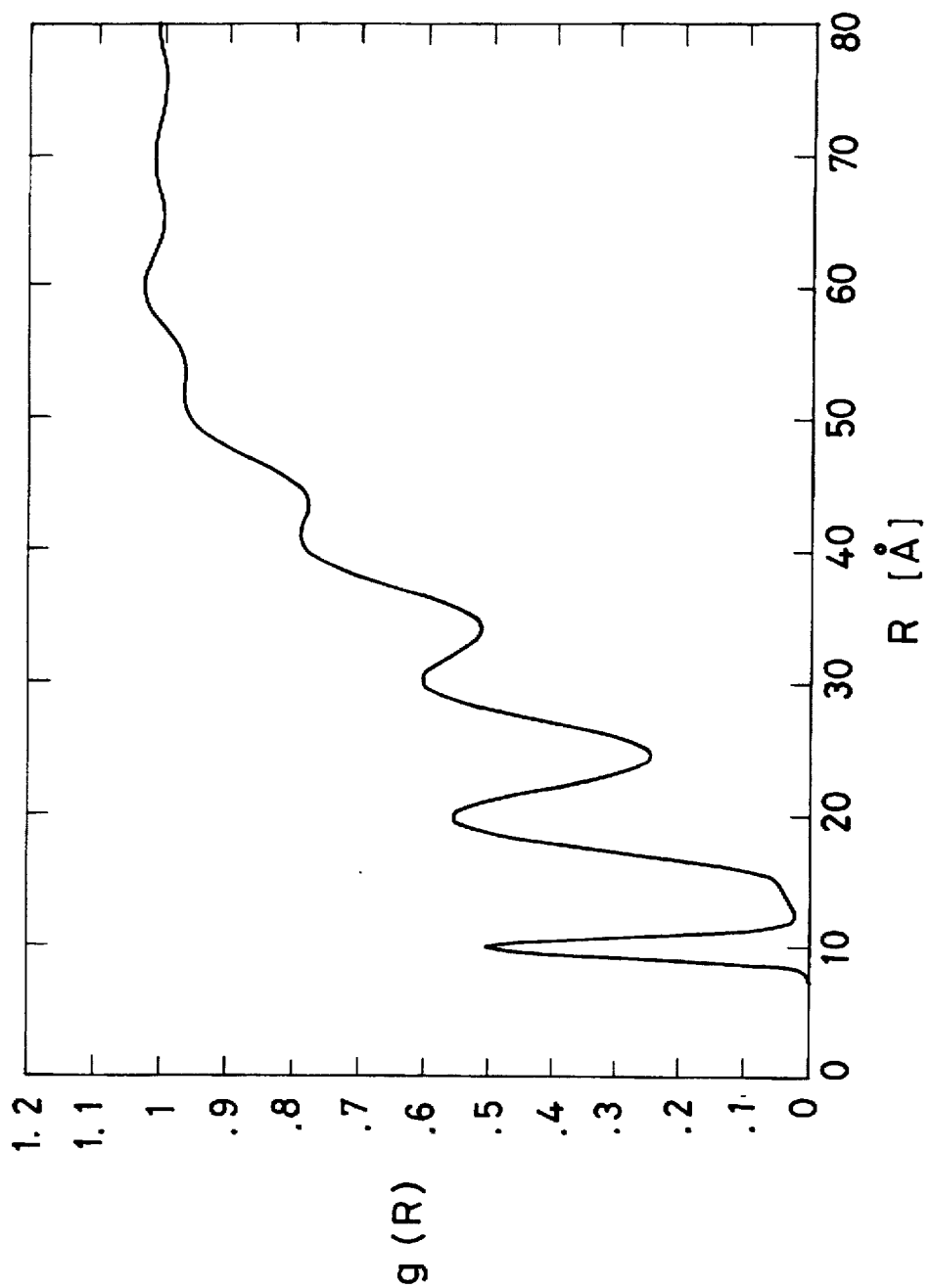
FIG. 9 is a graph showing a pair distribution function of a photoconductor of another comparative example.

The pair distribution g(R) of the photoconductive firm is shown in FIG. 9.

In the area, 30<R<45, the g(R) value was 0.7 or less.

The thus-produced photoreceptor was set in the electrophotographic printer with a back exposure system in the same manner as in Example 14. The half voltage exposure amount at a initial voltage 500 V was 5.0 [μJ$^{-1}$·cm$^2$]. As compared with the photoreceptor obtained in Example 15, the photoreceptor had extremely low sensitivity. After the irradiation, the resistivity of the photoreceptor in the dark became big. Therefore the photoreceptor could not be used repeatedly.

COMPARATIVE EXAMPLE 6

A photoreceptor was produced in the same manner as in Example 15, except that $C_{70}$ fullerene and carbazole were applied to the surface of the same support as in Example 15 by co-vapor deposition, so that fullerene-containing charge-transfer complexes were deposited at a thickness of 1000 angstroms.

The surface of this photoreceptor could not be charged, and the sensitivity could not be measured.

EXAMPLE 16

Both surfaces of a polyester film (240 mm×200 mm) having a thickness of 100 μm were coated with a gold coat to have a surface resistivity of 500 μΩ/□. The lengthwise sides of this film were fused together to form a cylinder of 240 mm×60 mm φ. On the outer surface of this cylinder, a photoconductive layer was prepared as follows: Fullerenes having a $C_{70}$ fullerene content of 80% by weight, N,N-diphenyl-N,N-bis(3-methylphenyl)-(1,1-biphenyl)-4,4-diamine and a polycarbonate resin were mixed at a ratio by weight of 1:1:3 that were dispersed in 1,1,2-trichloroethane by ball-milling for 100 hours to prepare a uniform dispersion. The resulting dispersion was coated on the outer surface of the cylinder so as to have a dry thickness of 20 μm.

The pair distribution function g(R) of the photoconductive layer was measured and had a first peak in the vicinity of R=11 (Å) and 0.7<g(R)<1.2 within the range of R≧18 (Å).

The photoreceptor was set in an electrophotographic printer with a back exposure system. After the surface of the photoreceptor was charged at 500 V, the photoreceptor was irradiated by applying data-writing radiation (wavelength λ=550 nm). The sensitivity was 0.7 [μJ$^{-1}$·cm$^2$]. Thus, the sensitivity of the photoreceptor was extremely high.

COMPARATIVE EXAMPLE 7

A photoreceptor was produced in the same manner as in Example 16, except that the photoconductive composition was not subjected to ball milling, and this was compared with the photoreceptor produced in Example 16. The pair distribution function g(R) resulting from the data of X-ray diffractometry of the photoreceptor produced herein gave a first peak appearing in the vicinity of R=11 (Å) and 0.7>g(R) within the range of R<50 (Å).

The photoreceptor was set in the electrophotographic printer of a back exposure system in the same manner as in Example 14. After the surface of the photoreceptor was charged at 500 V, the photoreceptor was irradiated by applying data-writing radiation (wavelength λ=550 nm). The sensitivity was 30.0 [μJ$^{-1}$·cm$^2$]. Thus, the sensitivity of the photoreceptor was low. After the irradiation, the resistivity of the photoreceptor in the dark became small, and the photoreceptor could not be used repeatedly.

EXAMPLE 17

In this example, photoconductive toner is prepared. Since fullerenes of the present invention have high carrier-generating efficiency, the amount of such fullerenes to be added to toner may be small. Such fullerenes can be added to various color toners.

In this example amorphous fullerenes are produced by rapidly vaporizing toluene from fullerenes dissolved in a toluene solution.

The fullerenes comprises about 80% of $C_{70}$ fullerene and about 20% of $C_{60}$ fullerene. The thus-obtained photoconductive aggregate is subjected to X-ray diffractometry. The X-ray diffraction pattern shall have no peak.

The fullerene aggregate shall have boson peaks within the neutron inelastic scattering region of about 5 meV or less.

Polyester of about 100 parts by weight, phthalocyanine of about 10 parts by weight, polypropylene of about 3 parts by weight, wax of about 2 parts by weight, charge-controlling agent of about 2 parts by weight and the amorphous fullerene aggregate prepared as above of about 1 part by weight are mixed and kneaded with hot rollers. After that, the resultant mixture is cooled, roughly ground and finely ground with an ultra-high speed jet mill. The resultant powder is then classified with a pneumatic classifier to obtain fine color particles (toner) having a mean particle size of about 7 μm.

The toner is spread on a conductive drum to form a thin toner layer on the dram. The thin layer is irradiated by laser to form a toner image on the thin layer at about 780 nm. As a result, the charged amount of the exposed area to the laser must be lowered due to the photoconductivity of the toner, and the exposed toner must be peeled from the exposed area. Thus, the toner image must be formed. The toner image is brought into contact with paper, so as to transport the toner image onto the paper. The toner image transported onto the paper must be good.

COMPARATIVE EXAMPLE 8

A toner is produced in the same manner as in Example 17, except that crystalline fullerenes is used, which is prepared by vaporizing the solvent from a benzene solution comprising fullerenes. The crystalline fullerenes shall shows give no peaks within the neutron inelastic scattering region of about 5 meV or less. The toner thus produced is evaluated in the same manner as in Example 17. As a result, the toner in the area exposed to the laser may not be peeled off from the drum.

EXAMPLE 18

In this example, a resist was prepared according to the present invention.

A thin fullerene film, formed on a glass substrate by vapor deposition in the same manner as in Example 14, was peeled from the glass substrate, and was used as a sensitizing material for a negative resist. The resulted fullerenes comprised 99% or more of $C_{70}$ fullerene and had a glass transition point of 310 K. The fullerenes gave boson peaks within the neutron inelastic scattering region of 5 meV or less. The sensitizing material was mixed with a resist at 5% by weight. The sensitivity of the resist containing the sensitizing material was higher than that of the resist not containing it by 6 times.

COMPARATIVE EXAMPLE 9

A negative resist was produced in the same manner as in Example 19, except that crystalline fullerenes comprising 99% or more of $C_{70}$ fullerene produced by crystallization from benzene solution were used as the sensitizing material. The crystalline fullerenes used did not have a glass transition point and gave no boson peak within the neutron inelastic scattering region of 10 meV or less. As a result of the evaluation of the negative resist, its sensitivity was not substantially different from the sensitivity of the resist not containing the fullerenes.

EXAMPLE 19

This example is performed to demonstrate the application of the present invention to a medium for photo-refractive holography in combination with a charge-transport material.

Ten % by weight of amorphous $C_{70}$ fullerene having a density of 1.700 [g/cm$^3$] prepared by rapidly cooling from about 500° C. to about −20° C. is mixed with a binder polymer. A positive hole-transport material of diethylaminobenzaldehydo-diphenylhydrazo is added at about 30% by weight to the polymer to obtain a holographic medium. Reference rays and incident rays are applied to this holographic medium whereby three-dimensional information data is recorded on the medium. The holographic medium must have high carrier-generating efficiency and it must be possible to write about 1000 cm$^3$ of three-dimensional information data in the medium at a total energy of about 10 µJ or less.

EXAMPLE 20

In this example, a optical storage film using an interphase transition between an amorphous phase and a crystalline phase of fullerenes is prepared.

Figure 10:
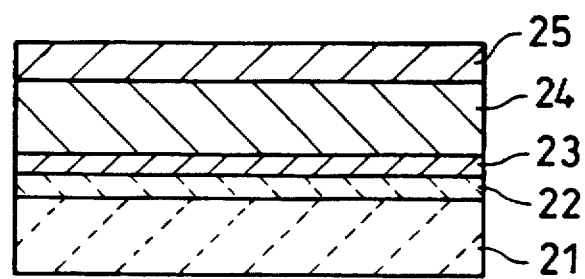
FIG. 10 is a cross-sectional view showing a optical storage element of an embodiment of the present invention.

FIG. 10 shows a sectional view of the photo-memory element prepared which is one of optical strage.

An ITO film(22), a semi-transparent Al electrode(23), a fullerene film(24) and an Au electrode(25) are formed on a substrate(21).

The ITO film and the semi-transparent Al electrode are formed on a glass substrate. The fullerene film comprising about 90% by of $C_{70}$ fullerene is formed on the electrode by hot vapor deposition in the same manner as in Example 14. During the process, the temperature of the substrate is maintained at about 30° C.

The structure of the fullerene film is analyzed by X-ray diffractometry. The pair distribution function g(R) obtained must be from about 0.8 to about 1.2 at a distance R of about 30 angstroms or more.

The electrode is formed on the fullerene film by ion-sputtering. Thus, a photo-memory element of FIG. 10 is obtained. Information data are written in this photo-memory element by applying an infrared laser from the side of the ITO film, while applying a bias voltage between the ITO and Au electrodes. As a result, the phase transition occurred only in the area exposed to the laser whereby the extinction coefficient of the thus-exposed area varied within the range of from about 490 nm to about 700 nm.

EXAMPLE 21

In this example, a photo-sensor element for visible ranges is prepared.

Au is deposited on ITO by vapor deposition, and a dispersion of about 30% by weight of 1,1-bis(4-diethylaminophenyl)-4,4'-diphenyl-1,3-butadiene molecularly dispersed in about 70% by weight of a bisphenol Z-type polycarbonate is coated thereover to form a charge-transport film having a thickness of about 20 µm on the Au-deposited film. In addition, a film of fullerenes comprising about 20% of $C_{60}$ fullerene, about 75% of $C_{70}$ fullerene and about 5% of other fullerenes is formed on the charge-transport film by sputtering. The neutron-scattering spectrum of the film gives boson peaks within the region of about 5 meV or less.

A semi-transparent Al electrode is provided on the fullerene film to produce a photo-sensor element. This photo-sensor is used with a bias voltage of about about 100 V between the Al and Au electrodes. It is confirmed that the photo-sensor can be utilized as an optical power meter for light having a wavelength range of from 400 nm to 680 nm within a light intention region of from about $10^{-4}$ [µJ$^{-1}$·cm$^2$] to about $10^3$ [µJ$^{-1}$·cm$^2$].

COMPARATIVE EXAMPLE 12

The same process as in Example 21 is repeated, except that the order of forming the charge-transport film and the fullerene film is varied. Concretely, Au is deposited on ITO by vapor deposition and a fullerene film is formed thereon. The sample having the constitution of ITO/Au/fullerenes is annealed at about 350° C. for about 30 hours.

This fullerene film may give no peak within the neutron inelastic scattering region of about 10 meV or less.

A charge-transport film and an Au electrode are formed on the fullerene film to produce a photo-sensor element. This sensor is evaluated in the same manner as in Example 21. The results showed that this photo-sensor element can be utilized as an optical power meter for light having a wavelength range of from about 400 nm to about 550 nm. However, the light intention range is only from about 1 [µJ$^{-1}$·cm$^2$] to about $10^2$ [µJ$^{-1}$·cm$^2$], which is too small to practical use.

EXAMPLE 22

Figure 11:
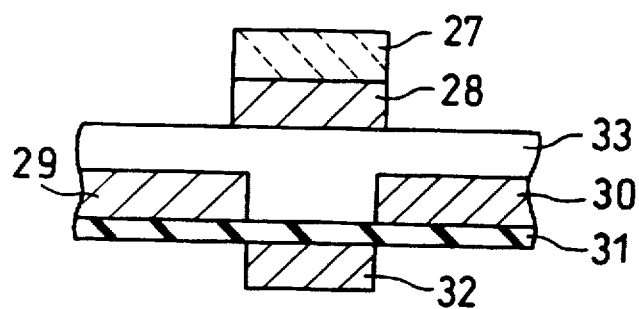
FIG. 11 is a cross-sectional view showing a photo-gating switch of an embodiment of the present invention.

FIG. 11 shows a sectional view of a photo-gating switch prepared in this.

A drain electrode(29) and a source electrode(30) is formed on of a surface of a insulating film(31). A semiconductor layer(33) covers the electrodes(29,30) and the insulating film(31). A fullerene film(28) is then evaporated on the semi-conductor layer(33), and a transparent electrode (27) is formed on the fullerene film(28).

The transparent electrode and the source electrode are set at about 0 V, the gate electrode is set at about −20 V relative to the electrodes and, the drain electrode is set at about −5 V relative to these. Where light is irradiated to the transparent electrode, current passes between the source and the drain. The quantity of light having a wavelength of about 500 nm passing the current therebetween is only about 0.5 [µJ$^{-1}$·cm$^2$] or less.

EXAMPLE 23

Figure 12:
FIG. 12 is a cross-sectional view showing a photo-modulator element of an embodiment of the present invention.

FIG. 12 shows a sectional view of a photo-modulator element prepared in this example.

A fullerene layer(34) is formed on a quartz substrate(35).

The photo-modulator element is produced in the following. An amorphous $C_{60}$ film having a thickness of about 0.05 µm is formed on the quartz substrate by vacuum vapor deposition.

The transmittance of the fullerene film at the quantity of light of about 1 m J$^{-1}$·cm$^2$ measured, using an argon ion laser (having a wavelength of 528 nm), is about 40%. Its transmittance measured at about 10 m J$^{-1}$·cm$^2$ must be about 25% or less. Thus, the element's transmittance is lowered with the increase in the quantity of light applied to the element, so as to control the light through the element. Therefore, the element is a good photo-modulator element.

EXAMPLE 24

Figure 13:
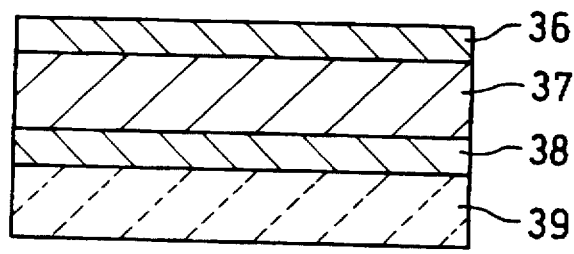
FIG. 13 is a cross-sectional view showing a solar cell of an embodiment of the present invention.

FIG. 13 shows a sectional view of a solar cell prepared in this example.

FIG. 13 shows a sectional view of a solar cell prepared in this example.

A semi-transparent aluminum electrode(38) is formed on the quartz substrate(39). A fullerene film(37) is then formed on the electrode(38). Then a gold electrode(36) is formed on the fullerene film(37).

The solar cell is produced in the following manner.

A semi-transparent aluminum electrode is formed on the quartz substrate. An amorphous $C_{70}$ fullerene film having a thickness of about 0.3 µm is formed on the electrode by vacuum vapor deposition. Au is deposited over the fluorine film by vapor deposition to form the upper electrode.

Where the aluminum electrode of the solar cell is negatively charged while the gold electrode is positively charged in the dark, the solar cell passes an electric current therethrough. However, if the aluminum electrode of the cell is positively charged while the gold electrode is negatively charged, the cell does not almost pass an electric current therethrough. In this example, the solar cell exhibited rectifying capacity.

When a monochromatic light having a wavelength of about 380 nm is irradiated to the cell from the side of the semitransparent aluminum electrode, high electromotive force is be generated between the positive aluminum electrode and the negative gold electrode. It is confirmed that the cell is a good solar cell. The degree of energy conversion efficiency of the solar cell is about 5% or more.

As above-mentioned, to obtain good properties in photoconductors or photoreceptors, it is preferable that an amount of dark conductivity of a layer containing fullerenes is small. The amount is preferably about $5\times10^{-14}$ $\Omega^{-1}m^{-1}$ or less at about 50V applied.

Additional advantages and modifications will readily occur to those skilled in the art. The invention in its broader aspects is therefore not limited to the specific details, representative apparatus and method, and illustrative examples shown and described. Accordingly, departures may be made from such details without departing from the spirit or scope of the general inventive concept. Thus, it is intended that this invention cover the modifications and variations of the invention provided they are within the scope of the appended claims and their equivalents.

We claim:

1. A photoconductor comprising a material selected from the group of at least one fullerene or derivatives thereof, wherein the fullerene or derivative thereof is present in an amorphous structure.

2. The photoconductor of claim 1,
   wherein said material has a pair distribution function g(R) value (R is a distance from an atom) between about 0.7 and about 1.3 at a distance R of greater than about 30 angstroms.

3. The photoconductor of claim 1,
   wherein the photoconductor provides a boson peak within a neutron inelastic scattering region of about 5 meV or less at temperatures not higher than a glass transition temperature of said material.

4. The photoconductor of claim 1,
   wherein said fullerene comprises a carbon cluster having a skeleton composed of 70 or more atoms and present in an amount of at least about 50% by weight of said material.

5. The photoconductor of claim 1,
   wherein said fullerenes or derivatives thereof are molecularly dispersed in a matrix polymer.

6. The photoconductor of claim 7,
   wherein said photoconductor is a layer having a thickness of about 300 µm or less.

7. The photoconductor of claim 1,
   wherein said material is the charge-generation material.

8. The photoconductor of claim 7,
   wherein said photoconductor is a layer having a thickness of about 1 µm or less.

9. A photoreceptor, comprising:
   a charge-generating layer; and
   a charge-transport layer formed on said charge-generating layer,
   wherein the charge-generating layer comprises a photoconductor comprising a material selected from the group of at least one fullerene or derivatives thereof arranged in an amorphous structure.

10. A photoconductor prepared by a process comprising the steps of:
    maintaining a substrate at 90° C. or lower, and
    bringing gaseous fullerene molecules into contact with the substrate to solidify the fullerene molecules on the substrate.

11. A photoconductor prepared by a process comprising the steps of:
    maintaining a substrate at between about 10° C. and about 50° C., and
    bringing gaseous fullerene molecules into contact with the substrate to solidify the fullerene molecules on the substrate.

12. The photoconductor comprising a material selected from the group of at least one fullerene or a derivative thereof;
    wherein said material has a pair distribution function g(R) value (R=distance from an atom) between about 0.7 and about 1.3 about 30 angstroms.

13. The photoconductor comprising a material selected from the group of at least one fullerene or a derivative thereof;
    wherein the photoconductor provides a boson peak caused by said material within a neutron inelastic scattering region of about 5 meV or less at temperatures not higher than a glass transition temperature of said material.

14. A photoconductor comprising a material selected from the group of at least one fullerene or derivatives thereof,
    wherein the photoconductor is characterized by at least one of:
    i) the fullerene and derivatives being arranged in an amorphous structure:
    ii) the material having a pair distribution function g(R) value (R=distance from an atom) between about 0.7 and about 1.3 about 30 angstroms; and
    iii) the pohotoconductor providing a boson peak caused by said material within a neutron inelastic scattering region of about 5 meV or less at temperatures not higher than a glass transition temperature of said material.

15. The photoconductor of claim 12,
    wherein said fullerene comprises a carbon cluster having a skeleton composed of 70 or more atoms and present in an amount of at least about 50% by weight of said material.

16. The photoconductor according to claim 13,
    wherein said fullerene comprises a carbon cluster having a skeleton composed of 70 or more atoms and present in an amount of at least about 50% by weight of said material.

17. The photoconductor according to claim 14,
wherein a dark conductivity of the photoconductor at about 50 V is about $5 \times 10^{-14}$ $\Omega^{-1}\text{m}^{-1}$ or less.

18. The photoconductor as claimed in claim 5, wherein the matrix polymer is selected from one or more of the group consisting of polyethylene resins, nylon resins, polyester resins, polycarbonate resins, polyacrylate resins, butyral resins, phenolic resins, styrene-butadiene copolymer resins, polyvinyl acetal resins, diallyl phthalate resins, polysulfone resins, acrylic resins, polyvinyl acetate resin polyphenylene oxide resins, alkyd resins, styrene-maleic anhydride copolymer resins, vinyl chloride-vinyl acetate copolymer resins, polyester carbonates, polyvinyl chlorides, polyvinyl acetals, polyarylates, or mixtures thereof.

19. An optical memory material comprising the photoconductor of claim 1.

20. An electrophotographic receptor comprising the photoconductor of claim 1.

* * * * *